US006257329B1

(12) United States Patent
Balzano

(10) Patent No.: US 6,257,329 B1
(45) Date of Patent: Jul. 10, 2001

(54) THERMAL MANAGEMENT SYSTEM

(76) Inventor: Alfiero Balzano, 11371 Monarch St., Garden Grove, CA (US) 92841

( * ) Notice: Subject to any disclaimer, the term of this patent is extended or adjusted under 35 U.S.C. 154(b) by 0 days.

(21) Appl. No.: 09/375,216

(22) Filed: Aug. 16, 1999

Related U.S. Application Data

(60) Provisional application No. 60/096,708, filed on Aug. 17, 1998.

(51) Int. Cl.$^7$ .......................................................... F28F 7/00
(52) U.S. Cl. ........................ 165/185; 174/252; 361/704
(58) Field of Search ............................ 165/185; 361/704, 361/719; 174/252

(56) References Cited

U.S. PATENT DOCUMENTS

| | | | | |
|---|---|---|---|---|
| 4,495,378 | * | 1/1985 | Dotzer et al. ........................ | 174/68.5 |
| 4,867,235 | * | 9/1989 | Grapes et al. ........................ | 165/185 |
| 5,077,637 | * | 12/1991 | Martorana et al. .................... | 60/650 |
| 5,386,339 | * | 1/1995 | Polinski, Sr. .......................... | 361/719 |
| 5,542,022 | * | 7/1996 | Zauderer ............................... | 392/485 |
| 5,787,713 | * | 8/1998 | Russo .................................. | 62/248.1 |
| 5,927,094 | * | 7/1999 | Nickum ................................ | 62/259.2 |
| 5,949,650 | * | 9/1998 | Bulante et al. ....................... | 361/704 |

* cited by examiner

*Primary Examiner*—Allen Flanigan
(74) *Attorney, Agent, or Firm*—Roger A. Marrs

(57) ABSTRACT

A thermal management system includes a compressed and heat treated graphite material layer or runs laminated between two layers of thin insulated layers providing an integral construction. Heat generating components are mounted on the insulation layers and openings are selectively placed in the insulation layers immediately adjacent to each heat generating component. Each opening is occupied by graphic material connecting with the runs of graphite material laminated between the insulated layers. Heat generated by the component is carried by the graphite in the openings serving as a connector to the graphite layer or run for transfer and connection away from the component. The graphite material layers serve as thermal bus lines designed into a suitable geometric configuration. The graphite material runs or strips terminate in a remote dissipation device or in a thermal utilization device.

5 Claims, 1 Drawing Sheet

THERMAL MANAGEMENT SYSTEM

This appln claims benefit of provisional appln No. 60/096,708 Aug. 17, 1998.

BACKGROUND OF THE INVENTION

1. Field of the Invention

The present invention relates to the field of thermal conductive devices, and more particularly to a novel highly efficient thermal conducting device capable of conducting thermal energy from a heat source to a dissipating means or to a means which can utilize the biproduct heat generated by the source.

2. Brief Description of the Prior Art

In the past, it has been the conventional practice to dissipate heat by placing a series of heat conductive plates in close spaced-apart relationship and placing this assembly into close proximity to a heat source so that the heat is absorbed by the plates and dissipated into the surrounding air or environment. Other forms of handling heat dissipating revolve around liquid conduction systems which may include coils such as are used in heat exchangers or the like. However, problems and difficulties have been encountered when using conventional heat sinks, thermal dissipation means or the like, which stem largely from that fact that the dissipated heat is lost and no useful production or advantage is taken. No means is provided for tapping or extracting the heat prior to dissipation so that it may be transported or conducted to a remote location where it can be used for operation or to advantage of other devices. Also, problems have been encountered with adjacent materials to a heat source relating to co-efficience of expansion. For example, "Kovar" chips employed in modern circuitry encounter severe thermal problems which limit their reliability and the term of operation when such material is used as a di-electric/material matrix material. Such interface has little or no coefficiency of expansion compatibility which is limiting in efficiency--and reliability of components.

A further problem in convention heat sinks or the like is the inability to flex or conduct thermal energy over an elongated expanse. Heat sinks are not known which are flexible so as to reduce the area or space in which heat sinks are normally installed. No means is employed in conventional heat sinks for tapping into the accumulated heat preparatory for dissipation so that the accumulated heat can be transferred or conducted to other devices for useful purposes.

Therefore, a long-standing need has existed to provide a novel thermal management system which includes a heat carrier composed of a graphite substance capable of carrying thermal energy from a heat source to an area where it is either dissipated or used for alternate purposes. The thermal management device or system includes a thermal conductive system especially applied to high speed and power electronic systems requiring efficiency and reliability of operation not only in the collection and dissipation or dispersion of heat but in associated components in an electrical circuit.

SUMMARY OF THE INVENTION

Accordingly, the above problems and difficulties are avoided by the present invention which provides a thermal management system including a compressed and heat treated graphite material layer laminated between two layers of thin insulated layers providing an integral and unitary construction. Heat generating components are mounted on either or both insulation layers and openings or "windows" are selectively placed in the insulation layer immediately adjacent to each heat generating component and each opening is occupied by graphic material connecting with the runs of graphite material sandwiched between the insulated layers. Thereby, heat generated by the component is carried by the graphite connector between layers to the graphite layer for transfer and connection away from the component.

The graphite material layers serve as thermal bus lines and are designed into a suitable geometric configuration so as to extend or run between additional components. The graphite material runs or strips terminate in a remote dissipation means or in a thermal utilization means. Intermediate flexible heat transfer runs may extend between rigid runs or paths of the graphite material and the dissipation or utilization means. Thereby, the thermal management system includes both rigid and flexible laminated graphite material layers arranged in suitable geographic configurations so as to connect heat generating sources or components with the ultimate dissipation or utilization means.

The interconnecting thermal conducting graphite layers between the components and the dissipation or utilization means may include taps or interconnection points for interconnecting various runs of the graphite material.

Therefore, it is among the primary objects of the present invention to provide a novel thermal management system which employs graphite which has been compressed and heat treated so as to provide elongated, interlinked, molecular crystallization runs or paths which carry thermal energy from a heat source such as an electrical component to a dissipation or utilization means.

Still a further object of the present invention is to provide a novel heat management system having a graphite layer laminated between two insulated layers having a formal reflow after cure which far exceeds the graphite's thermal carrying temperature.

Yet another object resides in a thermal management system employing a run or elongated path of graphite material which conducts heat at five times that of copper and at half the weight of aluminum.

Still a further object resides in a thermal management system wherein graphite layers or paths after heat treating and encapsulation interfaces with a plurality of dielectric/metal matrix material with little or no coefficient of expansion.

A further object resides in a thermal management system which can be specifically applied to high speed and power electronic systems requiring the removal of excess heat and that will conduct and transfer the heat to a remote location for introduction to either a heat dissipating means or for usage in a useful device or equipment.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description, taken in connection with the accompanying drawings in which:

DESCRIPTION OF THE PREFERRED EMBODIMENT

Figure 1:
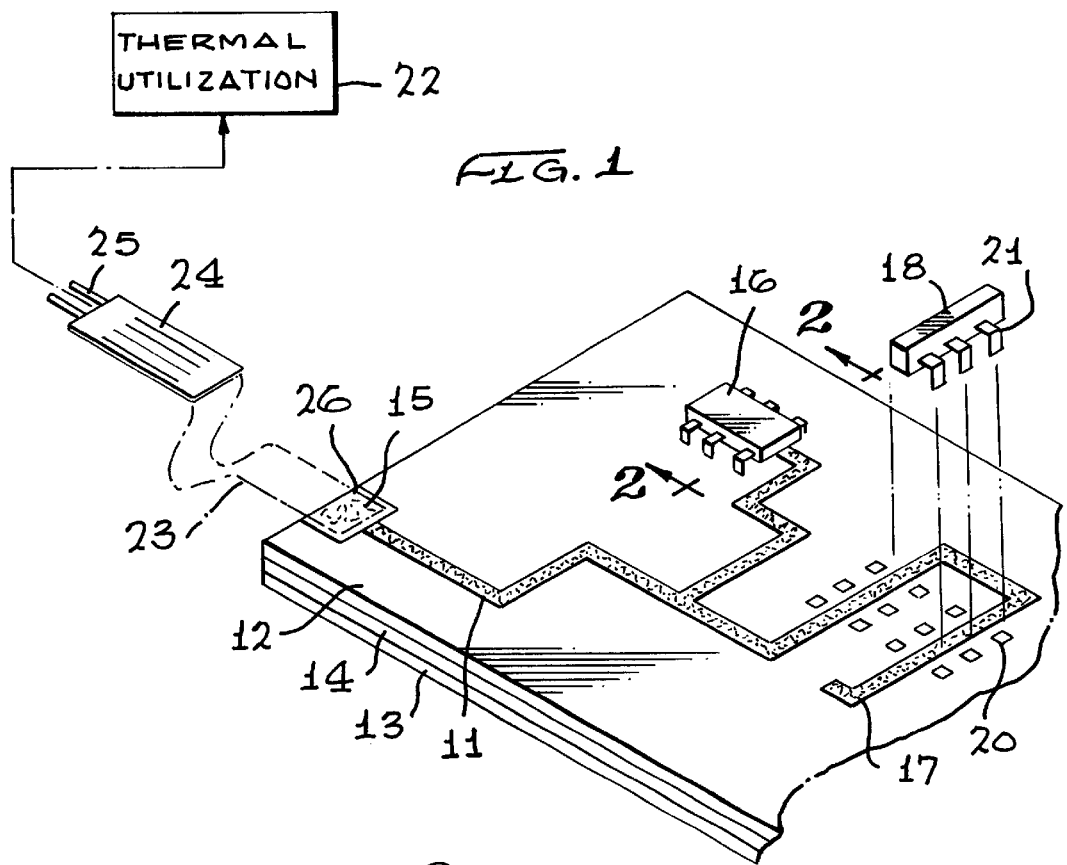
FIG. 1 is a perspective view of an electrical or electronic device incorporating the thermal management system of the present invention.

Referring to FIG. 1, the novel thermal management system incorporating the present invention is illustrated in the general direction of arrow 10 which includes a one strip or layer of graphite material, as indicated in general by numeral 11, which is laminated in a sandwich construction between two layers of thin insulator material, such as a top layer 12 and a bottom layer 13. An intermediate layer 14 is provided with a channel into which the graphite layer 11 is placed. The elongated run or length of graphite material 11 terminates at the peripheral edge of the laminated unitary construction in a pad 15 while the opposite end of the elongated run of graphite material terminates immediately below an electrical component 16 which is a heat generating source. In some constructions, the graphite material extends to terminate in a secondary run or path, indicated by numeral 17, which is associated with another heat generating electronic component 18. The components 16 and 18 may be carried on the top layer 12 by means of a plurality of holes, such as hole 20, intended to insertably receive connectors, such as connector 21 associated with component 18. However, it is important to note that the component will straddle a portion of the graphite layer run or path 17.

Heat generated by the components 16 and 18 is transferred from the components through the length of graphite material 11 to the pad 15 where the heat is then transferred to a thermal utilization means 22 that may take the form of either a heat dissipating sink or for utilization in some other form of application which includes thermal management designs and processes for microwave units, infra-red and radio frequency units, electrical distribution and component structures. The graphite layer or material 11 is an integral layer with the upper and lower layers 12 and 13 respectively and the intermediate layer 14 may be a graphite layer in its entirety or may be a channeled layer, as previously described wherein the channels are occupied by graphite material. In collecting and transferring thermal energy in pad 15 to a thermal utilization unit or means 22, a flexible or rigid member may be employed for interconnection. A flexible connector is indicated by numeral 23 while a rigid connector 24 may also be employed. The opposite ends of the connectors 23 and 24 are provided with suitable prongs or contacts, such as a pair of contacts 25 at one end or contacts 26 at the other end. Between the opposite ends of the connector member whether it is rigid or flexible, there is either a layer or paths composed of graphite material which conducts the thermal energy through the connector member between its opposite ends.

Figure 2:
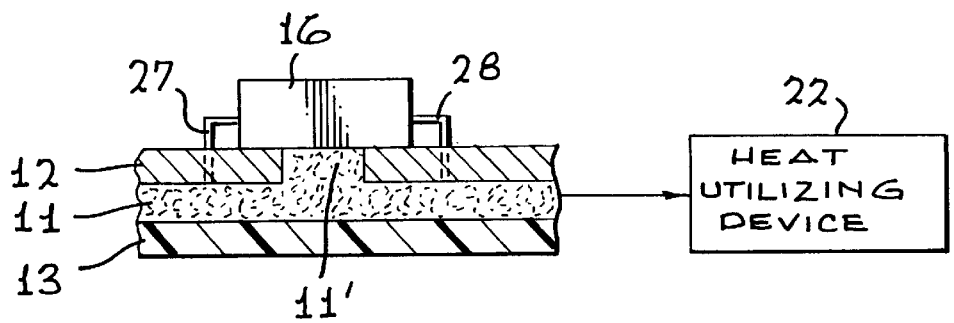
FIG. 2 is an enlarged fragmentary sectional view of the device shown in FIG. 1 as taken in the direction of arrows 2—2 thereof.

Referring now in detail to FIG. 2, it can be seen that the electronic component 16 which is of a heat generating source, is suitably connected to and mounted on the top layer 12 and that the top and bottom layers 12 and 13 are of a suitable electrical insulation material. The connectors to the component 16 are indicated by numerals 27 and 28 on opposite sides of the component and that the component straddles over the terminating end of the graphite material run or path 11. The portion of the graphite material immediately below and adjacent to the electrical component 16 is indicated by the numeral 11' and this material is in integral formation with the main run or path of graphite material 11. The graphite material may be within channels in intermediate layer 14 or may be a solid intermediate layer of graphite material. Therefore, heat or thermal energy generated by the electronic component 16 is collected by the portion 11' of graphite material and conducted through the extended run or length of graphite material 11 to the pad of graphite material 15. It is to be particularly noted that the graphite material 11' occupies an aperture or opening or "window" in the layer 12 so that the surface of this portion of graphite material is immediately adjacent to and engages the underside of the component 16. The heat generated and collected and transferred via the graphite material may be employed to energize or operate a heat utilizing device 22.

Figure 3:
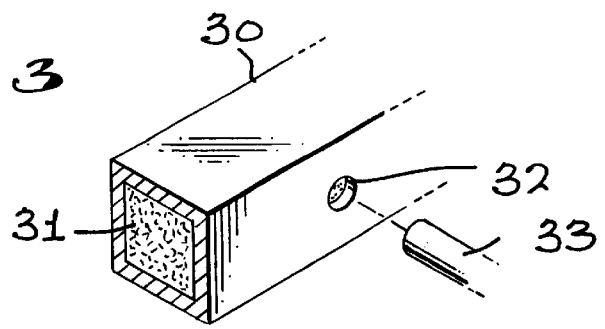
FIG. 3 is a perspective view of a heat reservoir and tap used in connection with the thermal management system of the present invention.

The thermal management system of the present invention shown in FIG. 3, further permits the graphite material 33 to be tapped into a heat source or sink 16 serving as a reservoir for storing thermal energy which is then subsequently used for other separate needs where such thermal energy or heat is required. In FIG. 3, an enclosure of ceramic or aluminum in the form of a tube or enclosure, as indicated by numeral 30, encloses a solid quantity of graphite material 31 where the heat is stored for use. The graphite material 31 is completely enclosed by the tube 30 and the tube 30 includes a plurality of port or openings, such as opening 32, serving as a port for insertably receiving a tap or stud 33. When the tap 33 is inserted through the opening 32 and comes into contact with the graphite material 31, the heat energy stored within the reservoir of graphite material 31 is conducted through the stud or tap 33 into a conduction member such as previously described with regard to member 24 which interconnects the reservoir of heat with a heat utilization device 22.

In view of the foregoing, it can be seen that the thermal management system of the present invention employs graphite material as a highly effective heat carrying medium so that the heat can be transferred from a heat source to a dissipation or utilization means. Dissipation may occur from convection, refrigeration or some other way of dissipating the heat. The thermal management system may be particularly applied to high speed and power electronic systems requiring the removal of heat from electronic components or the like. The main feature of the management system is the employment of graphite material which is initially compressed and heat-treated into elongated interlinked, molecular crystallization conduit paths or runs whereby thermal conductivity is greatly increased between the heat generating source and the heat dissipating or utilization means. The concept is particularly useful in electronic systems having printed circuit boards, flexible circuitry and/or rigid flex heat conduction mediums.

Initially, the graphite material is laminated or sandwiched between two layers of insulator material having a thermal reflow after curing which far exceeds the graphite thermal carrying temperature. The geometry which interfaces with the components requiring cooling preferably, as shown in the Figures, are immediately adjacent to a portion of the graphite material runs or paths. Where the thermal layer of graphite material is beneath the top layer of insulation material, windows or openings are left open to the direct interface with the underside of the component generating the heat. The openings or windows are occupied by a portion of the graphite material but is integrally formed with the elongated runs or paths of the graphite material. The thickness and width of the layers is determined by identifying the heat to be removed and the speed that heat removal is required. A thermal management layer of graphite material has been created which conducts heat at five times that of copper and at half the weight of aluminum.

Furthermore, by employing the graphite material, after heat treating and encapsulation interfaces with a multitude of dielectric/matrix material, little or no coefficient of expansion is experienced. Conventional materials used as carriers or conductors for thermal energy have severe thermal problems limited their reliability and term of operation. Using graphite material ensures that when the assembly is put through thermal stress within the range of −55 degrees F to +125 degrees F, it would be free of failures caused by thermal stress as the material tracks through the thermal zones.

With respect to useful applications, great use can be put into effect such as in automobiles and space vehicles. The graphite material can also be enclosed in ceramic substrates, in addition to aluminum tubes so as to carry the graphite material throughout a vehicle acting as first a structure of strength, second as a thermal conductor of material to be tapped into heat sinks or utilization means. Because the heat travels from hot to cold, there is "polarization" of the heat direction. Added polarization also takes place when graphite is heat treated and encapsulated under pressure. Lamination of graphite as an integral layer offers great consequences to the electronic designer of today's electronic system. The thermal management system may be employed in printed circuit boards, flexible circuit boards, ceramic substrates, mechanical structures or as inner layer molding to a chassis itself. Still an additional application is to encapsulate the graphite in a pattern covering the area of a blanket, for example. A thermal generator, electric generator or other heat source can be used as a central heat producer allowing heat to flow through the conductor of graphite material in the geometry of elongated paths or runs of a blanket so that the heat can be drawn off by a human body. The body would control the amount of heat it desired to be comfortable. The balance may be dissipated. This capability is achieved without electricity in the thermal conductor.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. In a thermal management system, a thermal conducting element comprising:

a compressed and heat treated graphite material composed of a molecular crystallization thermal energy conducting substance arranged in a planar geometric pattern;

a pair of outer insulative material layers separated by said graphite material and in laminated securement thereto to provide a unitary sandwich-type construction;

said graphite material having a connection portion exposed from between said pair of outer insulative material layers;

heat utilization means detachably coupled to said connection portion for transferring thermal energy from said graphite material for useful purposes;

at least one of said pair of outer insulative material layers having at least one opening occupied by a section of said graphite material exposed exteriorly of said one layer of outer insulative material whereby heat or thermal energy collected by said section is conducted into said graphite material for distribution along said planar geometric pattern to said connection portion;

a flexible thermal conductor disposed in coupling relationship with said connection portion interconnecting said connection portion with said heat utilization means; and said flexible thermal conductor having at least one elongated run of said graphite material laminated between a pair of flexible insulation sheets.

2. The thermal management system defined in claim 1 including:

a thermal tap engageable with said graphic material;

said thermal tap having an enclosure surrounding a run of said graphite material and further having a plurality of ports along the length of said enclosure; and a thermal conducting tap insertably received in said port to contact said enclosed graphite material and conduct thermal energy to said heat utilization means.

3. The thermal management system defined in claim 1 wherein:

said graphite material within said enclosure constitutes a heat reservoir for storaging thermal energy.

4. The thermal management system defined in claim 3 including:

a plurality of heat generating components secured to at least one of said pair of outer insulative material layers immediately adjacent to said opening occupied by said section of said graphite material for inductively receiving heat produced by said component for distribution to said heat utilization means via said graphite material laminated between said pair of outer insulative material layers.

5. The thermal management system defined in claim 4 wherein:

said heat generating component is secured over a selected one of said opening and in direct contact with said section of graphite material.

\* \* \* \* \*